(12) United States Patent
Lin et al.

(10) Patent No.: US 10,340,659 B1
(45) Date of Patent: Jul. 2, 2019

(54) ELECTRONICALLY PUMPED SURFACE-EMITTING PHOTONIC CRYSTAL LASER

(71) Applicant: CONARY ENTERPRISE CO., LTD., Taipei (TW)

(72) Inventors: Kuo-Jui Lin, Hsinchu (TW); Ming-Yang Hsu, Hsinchu (TW); Yu-Chen Chen, Hsinchu (TW)

(73) Assignee: Conary Enterprise Co., Ltd., Taipei (TW)

( * ) Notice: Subject to any disclaimer, the term of this patent is extended or adjusted under 35 U.S.C. 154(b) by 0 days.

(21) Appl. No.: 16/008,223

(22) Filed: Jun. 14, 2018

(51) Int. Cl.
*H01S 5/00* (2006.01)
*H01S 5/10* (2006.01)
*H01S 5/042* (2006.01)
*H01S 5/22* (2006.01)
*H01S 5/18* (2006.01)
*H01S 5/343* (2006.01)
*H01S 5/183* (2006.01)
*H01S 5/34* (2006.01)

(52) U.S. Cl.
CPC ............ *H01S 5/105* (2013.01); *H01S 5/0421* (2013.01); *H01S 5/0425* (2013.01); *H01S 5/18* (2013.01); *H01S 5/18308* (2013.01); *H01S 5/18319* (2013.01); *H01S 5/18344* (2013.01); *H01S 5/18394* (2013.01); *H01S 5/2205* (2013.01); *H01S 5/34* (2013.01); *H01S 5/343* (2013.01)

(58) Field of Classification Search
CPC ........ H01S 5/0425; H01S 5/18; H01S 5/2205; H01S 5/343; H01S 5/0421; H01S 5/105; H01S 5/18308; H01S 5/18319; H01S 5/18344; H01S 5/18394; H01S 5/34
See application file for complete search history.

(56) References Cited

U.S. PATENT DOCUMENTS

| 2007/0097680 | A1* | 5/2007 | Cao | ....................... B82Y 20/00 362/231 |
| 2007/0201527 | A1* | 8/2007 | Hori | .................... H01S 5/18333 372/50.124 |
| 2009/0196319 | A1* | 8/2009 | Hori | .................... H01S 5/18316 372/50.124 |

* cited by examiner

*Primary Examiner* — Kinam Park
(74) *Attorney, Agent, or Firm* — Rosenberg, Klein & Lee

(57) ABSTRACT

An electrically pumped surface-emitting photonic crystal laser includes an electric currents confinement structure arranged on a photonic crystal structure and an active layer with an opening, a transparent conducting layer arranged on the electric currents confinement structure and covering the photonic crystal structure, a metal anode arranged on the transparent conducting layer with an aperture. The photonic crystal laser has its epitaxy structure etched from above to fabricate the photonic crystal to allow laser beams to pass through with conductivity for the purpose of electrically pumping a quantum structure without complex technologies of wafer fusion bonding or epitaxial regrowth. Thereby the laser beams can be emitted from a front surface of the epitaxy structure with a narrow divergence angle.

13 Claims, 8 Drawing Sheets

ELECTRONICALLY PUMPED SURFACE-EMITTING PHOTONIC CRYSTAL LASER

BACKGROUND OF THE INVENTION

1. Field of the Invention

The invention relates to an electrically pumped surface-emitting photonic crystal laser that has a metal anode, a transparent conducting layer and an electrical currents confining structure combined to electrically pump a quantum structure thereof for a photonic crystal structure thereof to emit lasers from a surface of an epitaxy structure thereof.

2. Description of the Related Art

Photonic crystals are periodic metamaterials that can be fabricated by modern technology with features similar to solid crystals. In solid crystals, a band structure can be discovered from its dispersion relation; therefore, the same structure can be seen in photonic crystals as well. Furthermore, photonic crystals have forbidden band where electromagnetic waves with specific frequency cannot exist within as solid crystals have bandgaps. With the similarities, photonic crystals are able to control transmission of lights and therefore have been applied to photonic crystal lasers, photonic crystal fibers and similar applications in the field.

Photonic crystal lasers can be mainly divided into two types—defect lasers and band-edge lasers. Defect lasers are fabricated by creating one or a few holes among lattices of the photonic crystals to confine the electromagnetic waves and to form a cavity within the structure. The laser beams emitted from defect lasers have high quality and low threshold. On the other hand, band-edge lasers can produce slow light to lengthen the periodicity of the photons within the photonic crystals and to enhance the interaction between the photons and the gain media. In addition, such lasers do not confine the resonance region within a small volume but widen the resonance region to the entire photonic crystal for coherent oscillation in large area; and the laser emitted from the band-edge lasers diffract out from a surface of the photonic crystals to achieve surface-emission. Such lasers also have features of emission with a large area and narrow divergence angle, high power output and easy fabrication of 2-dimensional laser array.

The photonic crystal lasers are divided into electrically pumped and light excited types. Light excited lasers have high power laser source input to produce a large amount of electron-hole pairs to produce laser beams, while electrically pumped lasers have external electricity source to produce laser beams. Practically, electrically pumped photonic crystal lasers are dominant in the field. However, input of electric currents is difficult due to the lattice structure of photonic crystals; the routes for light transmission and distribution of the carriers are issues to be considered.

Furthermore, there are two manufacturing methods of fabricating the electrically pumped lasers: wafer fusion bonding and epitaxy regrowth. The former was performed successfully in 1999 by Noda from Kyoto University, bonding two wafers under high temperature and high pressure to fabricate an indium gallium phosphide (InGaP)/indium phosphide (InP) multiple-quantum-well laser operated by current pulse waves at room temperature. Such laser has a maximum output greater than 20 mW and a divergence angle narrower than 1.8°. The later was then presented in 2014 by Noda, fabricating a watt-class indium gallium arsenide (InGaAs)/aluminum gallium arsenide (AlGaAs) multiple-quantum-well laser by epitaxy regrowth, which is operated by continuous waves at room temperature. Such laser has a maximum output of 1.5 W and a divergence angle narrower than 3°.

Considering both wafer fusion bonding and epitaxy regrowth process of electrically pumped lasers are still complicated techniques, the inventor has invented an electrically pumped surface-emitting photonic crystal laser with simple structure for easier fabrication process.

SUMMARY OF THE INVENTION

It is a primary objective of the present invention to provide an electrically pumped surface-emitting photonic crystal laser that has an epitaxy structure etched toward the inside from the top to fabricate a photonic crystal. The laser further has indium tin oxide fabricated as electrodes for the laser to emit lasers and to possess conductivity without the complicated process of wafer fusion bonding and epitaxy regrowth in the conventional manufacturing process.

In order to achieve the above objectives, the electrically pumped surface-emitting photonic crystal laser comprises a substrate having a top surface and a bottom surface; a first cladding layer arranged on said top surface of the substrate; an active layer with a quantum structure arranged on said first cladding layer; a second cladding layer arranged on said active layer; a contact layer arranged on said second cladding layer in a shape of mesa and including a plurality of holes to form a photonic crystal structure, said photonic crystal structure further having a first area on a top surface thereof; an electrical currents confining structure arranged on said photonic crystal structure and on said active layer and including an opening corresponding to said first area on the photonic crystal structure, so as to confine electrical currents within the first area; a transparent conducting layer arranged on said electrical currents confining structure and including a second area on a top surface thereof, covering said first area of the photonic crystal structure and having said second area vertically aligned with said first area; a metal anode arranged on said transparent conducting layer with an aperture aligned with said second area of the transparent conducting layer to avoid blocking the first area; and a metal cathode arranged under said bottom surface of the substrate.

Whereby the metal anode, the transparent conducting layer, the electrical currents confining structure and the metal cathode are arranged correspondingly for electrically pumping the quantum structure, and then the photonic crystal structure surface-emits laser through the first area, the opening of the electrical currents confining structure and the second area of the transparent conducting layer to the aperture of the metal anode.

In a preferred embodiment, the second cladding layer has a thickness between 10 to 500 nm.

In a preferred embodiment, the holes of the contact layer are arranged in 2-dimension.

In a preferred embodiment, the electrical currents confining structure is made of a material selected from a group consisting of silicon nitride (SiNx), silicon oxide (SiOx) and polyimide.

In a preferred embodiment, the transparent conducting layer is made of a material selected from a group consisting of indium tin oxide (ITO), antimony tin oxide (ATO), fluorine doped tin oxide (FTO), aluminum zinc oxide (AZO), gallium zinc oxide (GZO), indium zinc oxide (IZO) and zinc oxide (ZnO).

In a preferred embodiment, the quantum structure includes at least a layer of quantum dots.

In a preferred embodiment, the layer of quantum dots is made of a material selected from a group consisting of indium arsenide phosphide (InAsP), gallium nitride (GaN), indium gallium arsenide (InGaAs), indium gallium nitride (InGaN), indium gallium phosphide (InGaP), aluminum gallium indium arsenide (AlGaInAs), aluminum gallium indium phosphide (AlGaInP) and gallium indium arsenide phosphide (GaInAsP).

In a preferred embodiment, the quantum structure includes at least a layer of quantum well.

In a preferred embodiment, the layer of quantum well is made of a material selected from a group consisting of InAsP, GaN, InGaAs, InGaN, InGaP, AlGaInAs, AlGaInP and GaInAsP.

In a preferred embodiment, the present invention further includes a buffer layer between the substrate and the first cladding layer.

In a preferred embodiment, the present invention further includes a first graded-index layer between the buffer layer and the first cladding layer.

In a preferred embodiment, the present invention further includes a first separate confinement heterostructure between the first cladding layer and the active layer and a second separate confinement heterostructure between the active layer and the second cladding layer.

In a preferred embodiment, the present invention further includes a second graded-index layer between the second cladding layer and the contact layer.

With structures disclosed above, the present invention has ITO made for the transparent conducting layer and the electric currents confining structure controlling electric currents to slow down the loss on boundaries of the photonic crystals and to successfully emit laser beams at room temperature.

DETAILED DESCRIPTION OF THE PREFERRED EMBODIMENT

Figure 1A:
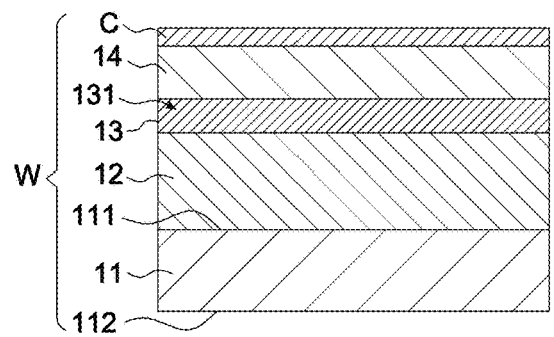
FIG. 1A is a schematic diagram of an epitaxy structure of the present invention.
Figure 1B:
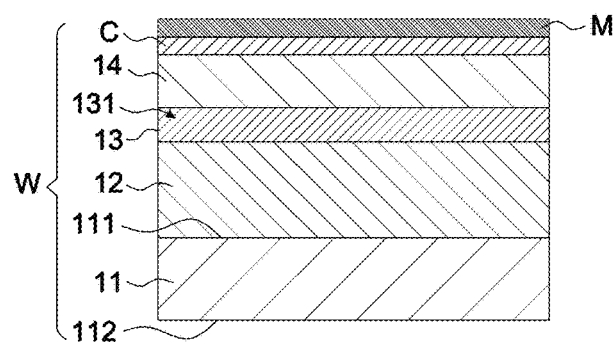
FIG. 1B is a schematic diagram illustrating fabrication of a hard mask of the present invention.

Referring to FIGS. 1A-1L, in a preferred embodiment, an electrically pumped surface-emitting photonic crystal laser 10A mainly includes a substrate 11, a first cladding layer 12, an active layer 13, a second cladding layer 14, a contact layer C, a hard mask M, a photonic crystal structure 15, an electrical currents confining structure 16, a transparent conducting layer 17, a metal anode 18 and a metal cathode 19.

The substrate 11 has a top surface 111 and a bottom surface 112. In this embodiment, the substrate 11 is made of a material selected from a group consisting of gallium nitride (GaN), gallium arsenide (GaAs) and indium phosphide (InP), but it is not limited to such composition.

The first cladding layer 12 is arranged on the top surface 111 of the substrate 11. In this embodiment, the first cladding layer 12 is made of a material selected from a group consisting of aluminum gallium arsenide (AlGaAs), GaAs, aluminum gallium nitride (AlGaN), aluminum gallium indium arsenide (AlGaInAs) and aluminum gallium indium phosphide (AlGaInP), but it is not limited to such composition.

The active layer 13 is arranged on the first cladding layer 12 and has a quantum structure 131.

The second cladding layer 14 is arranged on the active layer 13. In this embodiment, the second cladding layer 14 has a thickness between 10 to 500 nm and is made of a material selected from a group consisting of AlGaAs, GaAs, AlGaN, AlGaInAs and AlGaInP, but it is not limited to such composition.

The contact layer C is arranged on the second cladding layer 14. In the embodiment, the contact layer C is made of a material selected from a group consisting of GaN, GaAs and indium gallium arsenide phosphide (InGaAsP), but it is not limited to such composition.

Figure 1C:
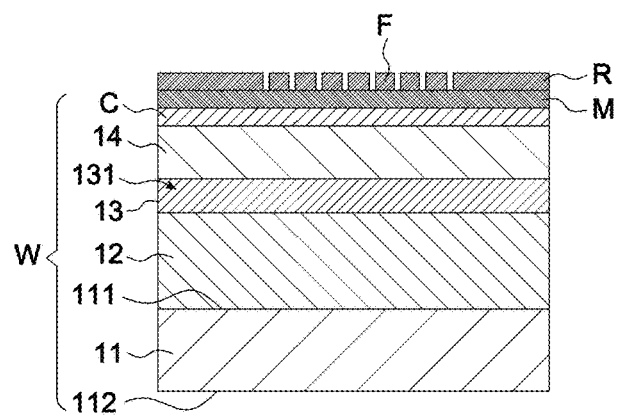
FIG. 1C is a schematic diagram illustrating a geometric pattern formed on the hard mask of the present invention.
Figure 1D:
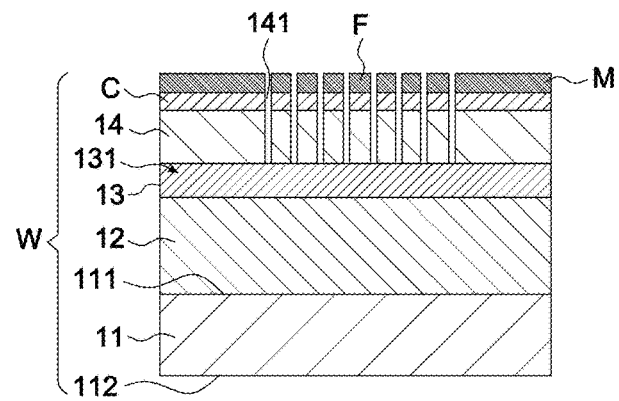
FIG. 1D is a schematic diagram illustrating imprint of the geometric pattern.
Figure 1E:
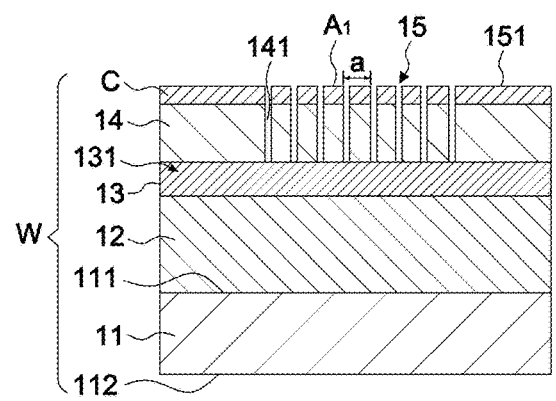
FIG. 1E is a schematic diagram illustrating the hard mask being removed.

With reference to FIG. 1A, the substrate 11, the first cladding layer 12, the active layer 13, the second cladding layer 14 and the contact layer C fabricated an epitaxy structure W, but the layers of the epitaxy structure W is not limited. Further with reference to FIG. 1B, the hard mask M is fabricated by having silicon nitride (SiNx) deposited on the epitaxy structure W, but the present invention is not limited to such application. With reference to FIG. 1C, a geometric pattern F is formed by having positive photoresist R applied on the epitaxy structure W within a square area of 290 μm; but the present invention is not limited to such application. FIG. 1D illustrated the imprint of the geometric pattern F. The geometric pattern F is imprinted onto the hard mask M and then the positive photoresist R is removed; then the geometric pattern F is further imprinted onto the epitaxy structure W. Since a waveguide pattern of the quantum structure 131 mostly restricts the laser within the active layer 13, deep etching is required for better bonding. When the depth of etching is greater than 500 nm, the bonding efficiency of the photonic crystals is better, but the present invention is not limited to such application. FIG. 1E further illustrated the removal of the hard mask M.

Figure 1F:
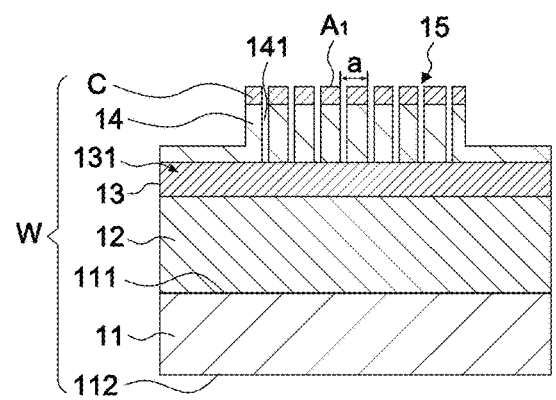
FIG. 1F is a schematic diagram illustrating a mesa formed by etching.
Figure 2A:
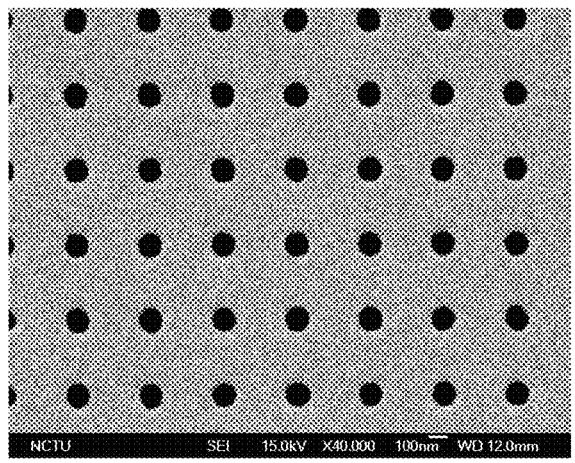
FIG. 2A is a top plan view of a photonic crystal structure of the present invention under an electron microscope.
Figure 2B:
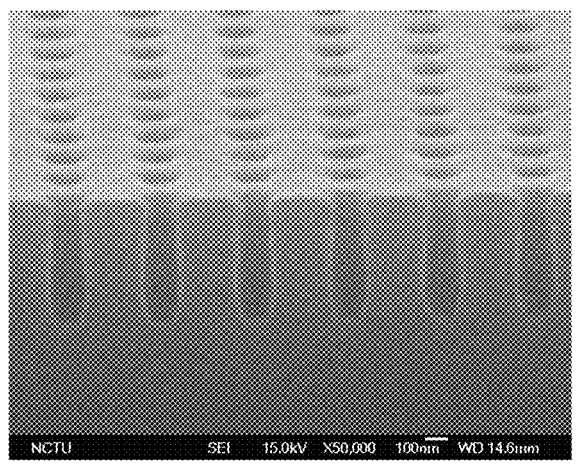
FIG. 2B is a sectional view of the photonic crystal structure of the present invention under an electron microscope.

With reference to FIG. 1F, a square mesa of 310 μm on the second cladding layer 14 and the contact layer C is fabricated by photolithography with an etching depth of 450 nm. The mesa further includes a plurality of holes 141 to form the photonic crystal structure 15 with a plurality of first areas $A_1$ on a top surface 151 of the photonic crystal structure 15. The purpose of the mesa is to limit the laser beams within the photonic crystals and reduce leakage currents. In this embodiment, the periodicity a of the photonic crystal structure 15 is 385 nm, 388 nm, 390 nm, 393 nm or 395 nm, but the present invention is not limited to such application. Additionally, the holes 141 of the mesa as shown in FIGS. 2A and 2B the are arranged in a column shape with a depth of 520-540 nm and a diameter of 130-140 nm; and the holes 141 are arranged in 2-dimension, but the present invention is not limited to such application.

Figure 1G:
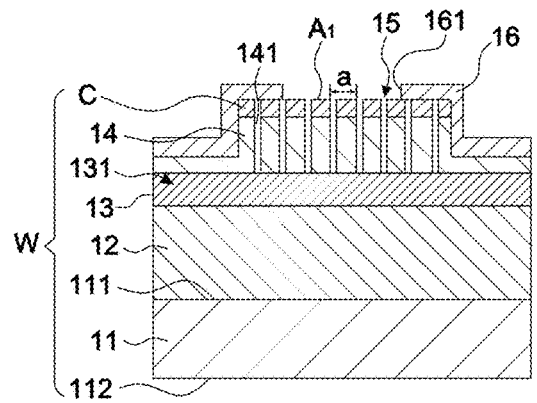
FIG. 1G is a schematic diagram illustrating fabrication of an electrical currents confining structure of the present invention.

FIG. 1G illustrated the fabrication of the electric currents confining structure 16. Since photonic crystals have infinite periodicity, theoretically, there would not be loss on boundaries; however, the photonic crystals for application actually have finite periodicity, so there would be loss on boundaries during operation. Therefore, to reduce the loss on boundaries during operation, an area of the photonic crystals is arranged to be greater than a gain area of the device; additionally, the photonic crystals having an area 2-3 times greater than a gain area of the device can still produce laser beams successfully. Consequently, photolithography is applied to the present invention to fabricate a geometric pattern of an opening 161 in the middle of the first areas $A_1$ of the photonic crystal structure 15 with a diameter of 150 μm; then SiNx is deposited with a thickness of 120 nm. After removing unnecessary SiNx by lift-off process, the opening 161 is fabricated correspondingly to the first areas $A_1$ to confine electrical currents within the first areas $A_1$ and to enable the laser pattern to exist within the photonic crystal structure 15 similar to one with infinite periodicity. In this embodiment, the electrical currents confining structure 16 is made of a material selected from a group consisting of SiNx, silicon oxide (SiOx) and polyimide, but the present invention is not limited to such application.

Figure 1H:
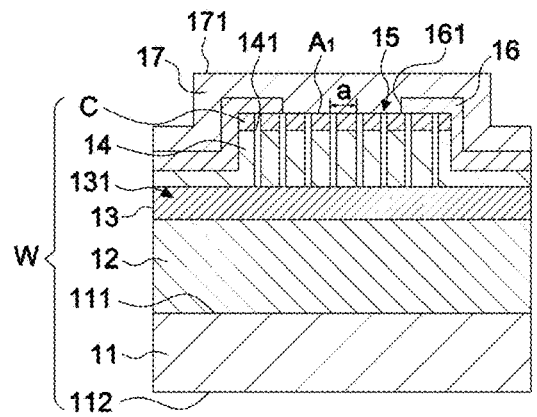
FIG. 1H is a schematic diagram illustrating fabrication of a transparent conducting layer of the present invention.

FIG. 1H illustrated the fabrication of the transparent conducting layer 17. Since the present invention is a surface-emitting laser, covering a great area of metal around the area for emission would affect the emission. Therefore, indium tin oxide (ITO) is selected for fabrication of the transparent conducting layer 17 due to its transmission property. The transparent conducting layer 17 is formed by having ITO fabricated with a thickness of 225 nm by an e-gun evaporator. The transparent conducting layer 17 is arranged on the electrical currents confining structure 16 and covering the first areas $A_1$ of the photonic crystal structure 15; a second area $A_2$ is further arranged on a top surface 171 of the transparent conducting layer 17, thereby the second area $A_2$ is vertically aligned with the first areas $A_1$. In this embodiment, the transparent conducting layer 17 is made of a material selected from a group consisting of ITO, antimony tin oxide (ATO), fluorine doped tin oxide (FTO), aluminum zinc oxide (AZO), gallium zinc oxide (GZO), indium zinc oxide (IZO) and zinc oxide (ZnO), but the present invention is not limited to such application.

Figure 1I:
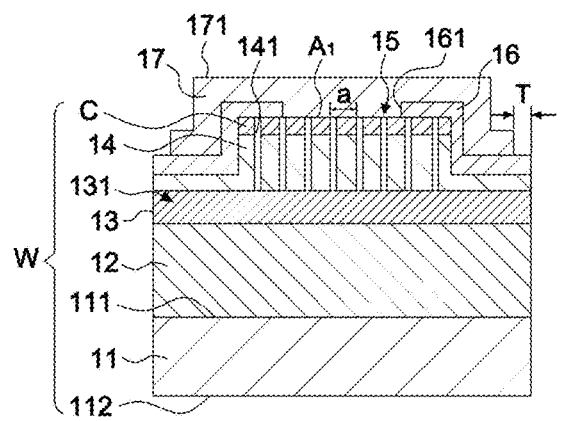
FIG. 1I is a schematic diagram illustrating a plurality of trenches regarded as boundaries of isolation on the present invention.
Figure 1J:
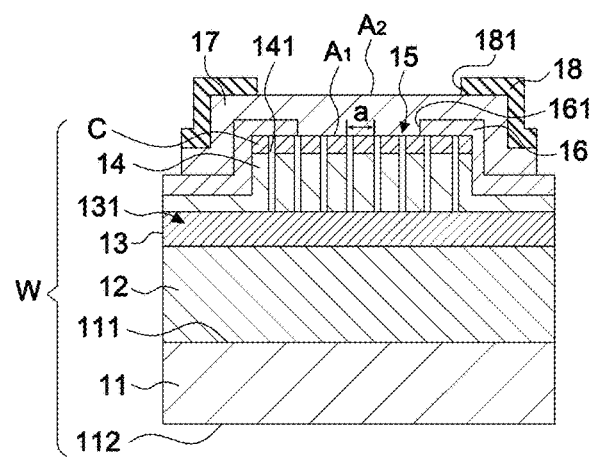
FIG. 1J is a schematic diagram illustrating deposition of metal anode of the present invention.

Further referring to FIG. 1I, after fabrication of the transparent conducting layer 17, a trench T is fabricated by photolithography to form a boundary for isolation. Then ITO in the trench T is removed by etching liquid. FIG. 1J illustrated the deposition of the metal anode 18. An electrode pattern is fabricated by photolithography and then titanium (Ti) and gold (Au) are deposited and removed by lift-off process to form the metal anode 18 on the transparent conducting layer 17 with an aperture 181 aligned with the second area $A_2$ of the transparent conducting layer 17 to avoid blocking the first area $A_1$; but the present invention is not limited to such application.

Figure 1K:
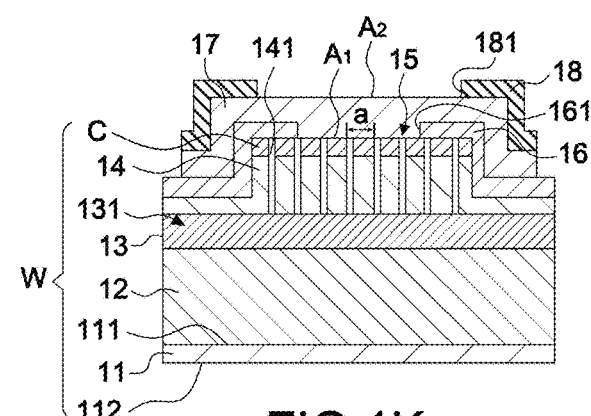
FIG. 1K is a schematic diagram a thickness of a substrate of the present invention being reduced.
Figure 1L:
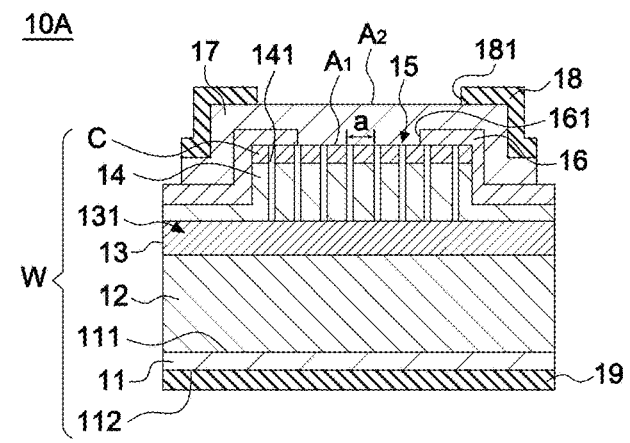
FIG. 1L is a schematic diagram illustrating deposition of metal cathode of the present invention.

FIG. 1K illustrated the thickness of the substrate 11 is reduced for the bottom surface 112 thereof to be a mirror-like surface. FIG. 1L illustrated the deposition of nickel (Ni), germanium (Ge) and gold (Au) to fabricate the metal cathode 19 on the bottom surface 112 of the substrate 11. Then the electrically pumped surface-emitting photonic crystal laser 10A is fabricated after rapid thermal annealing process. Still, the present invention is not limited to such application.

Figure 3:
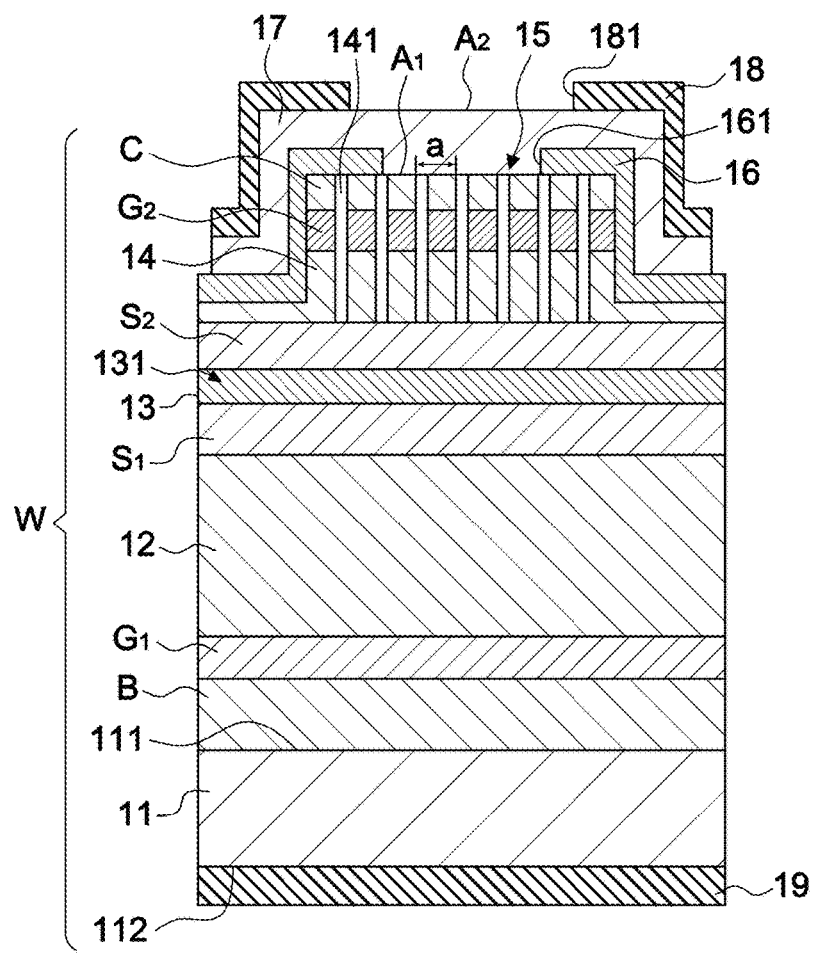
FIG. 3 is a preferred embodiment of the present invention.

FIG. 3 illustrated an electrically pumped surface-emitting photonic crystal laser 10B in another embodiment. In addition to the structure disclosed above, the electrically pumped surface-emitting photonic crystal laser 10B further includes a buffer layer B between the substrate 11 and the first cladding layer 12. In this embodiment, the buffer layer B is made of a material selected from a group consisting of GaN, GaAs and InP and has a thickness of 200 nm; a first graded-index layer $G_1$ is arranged between the buffer layer B and the first cladding layer 12. In this embodiment, the first cladding layer 12 is made of AlGaAs and the composition of the chemical formula is $Al_{0.4}Ga_{0.6}As$. The proportion of aluminum is graded from 0.4 to 0.1 for the purpose of alleviation of barriers in-between the GaAs and the AlGaAs. A thickness of the first cladding layer 12 is 1.3 μm and a thickness of the first graded-index layer $G_1$ is 150 nm, made of a material selected from a group consisting of AlGaAs, GaAs, AlGaN, AlGaInAs and AlGaInP. A first separate confinement heterostructure $S_1$ is arranged between the first cladding layer 12 and the active layer 13 and a second separate confinement heterostructure $S_2$ is arranged between the active layer 13 and the second cladding layer 14. In this embodiment, the first and second separate confinement heterostructure $S_1$, $S_2$ are made of a material selected from a group consisting of AlGaAs, GaAs, AlGaN, AlGaInAs and AlGaInP. The separate confinement heterostructures have a function of confining carriers and light field during operation. The first separate confinement heterostructure $S_1$ has a thickness of 130 nm and the second separate confinement heterostructure $S_2$ has a thickness of 105 nm. A second graded-index layer $G_2$ is arranged between the second cladding layer 14 and the contact layer C. The second cladding layer 14, the second graded-index layer $G_2$ and the contact layer C are fabricated into a shape of a mesa with a plurality of holes 141 therein to form the photonic crystal structure 15. In this embodiment, the second cladding layer 14 is made of AlGaAs and the composition of the chemical formula is $Al_{0.4}Ga_{0.6}As$. The proportion of aluminum is graded from 0.4 to 0.1 for the purpose of alleviation of barriers in-between the GaAs and the AlGaAs. A thickness of the second cladding layer 14 is 200 nm and a thickness of the second graded-index layer $G_2$ is 150 nm, made of a material selected from a group consisting of AlGaAs, GaAs, AlGaN, AlGaInAs and AlGaInP. However, the present invention is not limited to such applications.

An epitaxy structure W is therefore fabricated by the substrate 11, the buffer layer B, the first graded-index layer $G_1$, the first cladding layer 12, the first separate confinement heterostructure $S_1$, the active layer 13, the second separate confinement heterostructure $S_2$, the second cladding layer 14 the second graded-index layer $G_2$ and the contact layer C, but the layers of the epitaxy structure W is not limited. Moreover, the structure above the active layer 13 is a p-type semiconductor with beryllium dopant at an amount of $10^{18}$ $cm^{-3}$ and the contact layer C is heavily doped at an amount of $10^{19}$ $cm^{-3}$ for better ohmic contact with the ITO. The structure under the active layer 13 is an n-type semiconductor with silicon dopant at an amount of $10^{18}$ $cm^{-3}$. The materials fabricating the substrate 11, the buffer layer B, the first graded-index layer $G_1$, the first cladding layer 12, the first separate confinement heterostructure $S_1$, the second separate confinement heterostructure $S_2$, the second cladding layer 14 the second graded-index layer $G_2$ and the contact layer C also allow a wavelength of the laser to include blue and infrared lights.

Figure 4A:
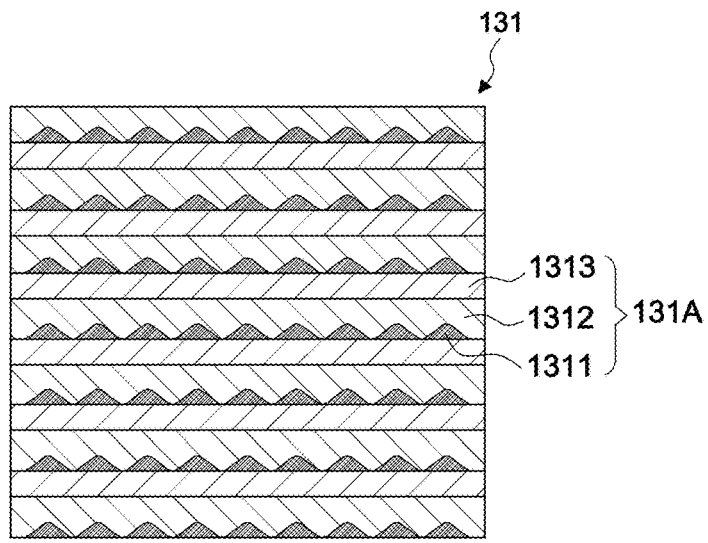
FIG. 4A is a schematic diagram of a quantum structure according to the present invention.

Further referring to FIG. 4, the quantum structure 131 includes at least a layer of quantum dots 131A. In this embodiment, the layer of quantum dots 131A is made of a material selected from a group consisting of indium arsenide phosphide (InAsP), gallium nitride (GaN), indium gallium arsenide (InGaAs), indium gallium nitride (InGaN), indium gallium phosphide (InGaP), AlGaInAs, AlGaInP and gallium indium arsenide phosphide (GaInAsP). In this embodiment, the quantum structure 131 has seven layers of quantum dots 131A, each layer having a quantum dot 1311, a cap layer 1312 and a space layer 1313. The quantum dot 1311 is covered by a cap layer 1312 and the cap layer 1312 is cover by the space layer 1313. The quantum dot 1311 is made of 2.2-monolayer InAs; the cap layer 1312 is made of InGaAs with a thickness of 5 nm, and the composition of the chemical formula is $In_{0.15}Ga_{0.85}As$. The space layer 1313 is made of GaAs with a thickness of 45 nm. However, the present invention is not limited to such applications.

Figure 4B:
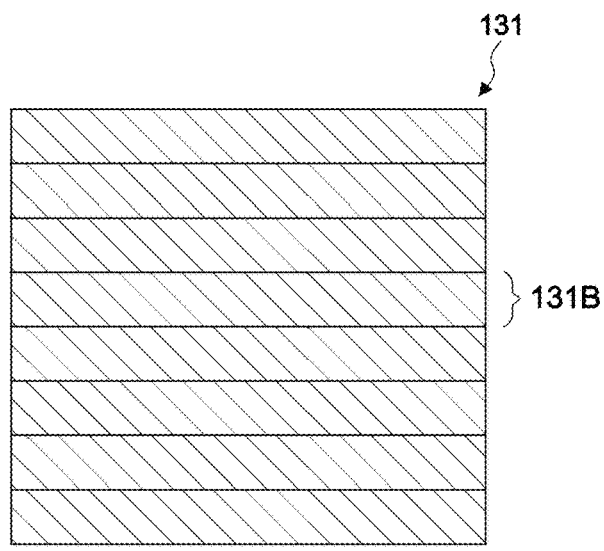
FIG. 4B is a schematic diagram of another quantum structure according to the present invention.

Referring to FIG. 4B, the quantum structure 131 includes at least a layer of quantum well 131B. In this embodiment, the layer of quantum well 131B is made of a material selected from a group consisting of InAsP, GaN, InGaAs, InGaN, InGaP, AlGaInAs, AlGaInP and GaInAsP, but the present invention is not limited to such application.

With structures disclosed above, the present invention has the quantum structure 131 as the gain media to successfully fabricate the electrically pumped surface-emitting photonic crystal laser operable at room temperature. The periodicity a of the photonic crystal structure 15 is 385 nm, 388 nm, 390 nm, 393 nm or 395 nm, a wavelength of emitted laser beam is around 1.3 μm; in other words, the wavelength of emitted laser beam is variable since the wavelength becomes longer as the periodicity a of the photonic crystal structure 15 gets longer. On the other hand, the present invention does not require complex techniques of wafer fusion bonding and epitaxial regrowth for fabrication; instead, it has the epitaxy structure W etched from the top for fabrication of the photonic crystal structure 15 and has ITO applied thereon as the transparent conducting layer 17, so as to enable laser beams to be emitted from a front surface of the epitaxy structure W and to bring features of surface-emission and narrow divergence angle.

Figure 5:
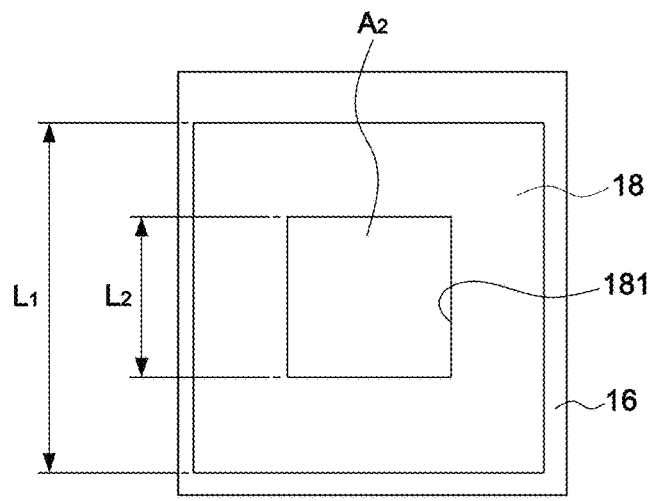
FIG. 5 is a top plan view of the present invention.
Figure 6:
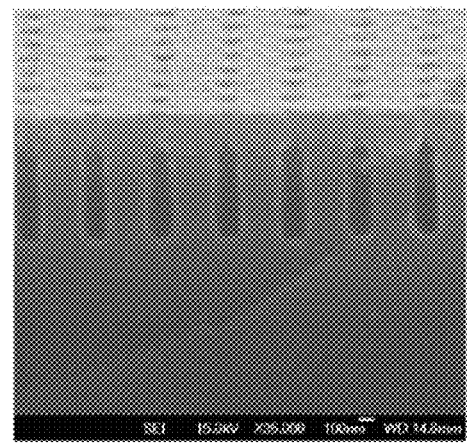
FIG. 6 is a sectional view of the present invention under an electron microscope.

The difference between the embodiments is the materials for growing the epitaxy, but both embodiments have the metal anode 18, the transparent conducting layer 17, the electrical currents confinement structure 16 and the metal cathode 19 operated to electrically pump the quantum structure 131; then the photonic crystal structure 15 surface-emits laser beams to the first areas $A_1$, the opening 161 of the electric currents confinement structure 16, the second area $A_2$ of the transparent conducting layer 17 and through the aperture 181 of the metal anode 18. As shown in FIG. 5, an outer and inner side-length of the square aperture 181 is respectively 650 μm and 300 μm, and the aperture 181 exposes the second area $A_2$ of the transparent conducting layer 17 therein. Also, the fabrication of the electric currents confinement structure 16 and the transparent conducting layer 17 as shown in FIG. 6 can be compared with FIGS. 2A and 2B in which they are not fabricated yet to further illustrate the position of the electric currents confinement structure 16 and the transparent conducting layer 17 on the electrically pumped surface-emitting photonic crystal laser 10A, 10B.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. An electrically pumped surface-emitting photonic crystal laser, comprising:
   a substrate having a top surface and a bottom surface;
   a first cladding layer arranged on said top surface of the substrate;
   an active layer with a quantum structure arranged on said first cladding layer;
   a second cladding layer arranged on said active layer;
   a contact layer arranged on said second cladding layer in a shape of mesa and including a plurality of holes to form a photonic crystal structure, said photonic crystal structure further having a first area on a top surface thereof;
   an electrical currents confining structure arranged on said photonic crystal structure and on said active layer and including an opening corresponding to said first area on the photonic crystal structure, so as to confine electrical currents within the first area;
   a transparent conducting layer arranged on said electrical currents confining structure and including a second area on a top surface thereof, covering said first area of the photonic crystal structure and having said second area vertically aligned with said first area;
   a metal anode arranged on said transparent conducting layer with an aperture aligned with said second area of the transparent conducting layer to avoid blocking the first area; and
   a metal cathode arranged under said bottom surface of the substrate;
   whereby the metal anode, the transparent conducting layer, the electrical currents confining structure and the metal cathode are arranged correspondingly for electrically pumping the quantum structure, and then the photonic crystal structure surface-emits laser through the first area, the opening of the electrical currents confining structure and the second area of the transparent conducting layer to the aperture of the metal anode.

2. The electrically pumped surface-emitting photonic crystal laser as claimed in claim 1, wherein the second cladding layer has a thickness between 10 to 500 nm.

3. The electrically pumped surface-emitting photonic crystal laser as claimed in claim 1, wherein the holes of the contact layer are arranged in 2-dimension.

4. The electrically pumped surface-emitting photonic crystal laser as claimed in claim 1, wherein the electrical currents confirming structure is made of a material selected from a group consisting of silicon nitride (SiNx), silicon oxide (SiOx) and polyimide.

5. The electrically pumped surface-emitting photonic crystal laser as claimed in claim 1, wherein the transparent conducting layer is made of a material selected from a group consisting of indium tin oxide (ITO), antimony tin oxide (ATO), fluorine doped tin oxide (FTO), aluminum zinc oxide (AZO), gallium zinc oxide (GZO), indium zinc oxide (IZO) and zinc oxide ZnO.

6. The electrically pumped surface-emitting photonic crystal laser as claimed in claim 1, wherein the quantum structure includes at least a layer of quantum dots.

7. The electrically pumped surface-emitting photonic crystal laser as claimed in claim 6, wherein the layer of quantum dots is made of a material selected from a group consisting of indium arsenide phosphide (InAsP), gallium nitride (GaN), indium gallium arsenide (InGaAs), indium gallium nitride (InGaN), indium gallium phosphide (InGaP), aluminum gallium indium arsenide (AlGaInAs), aluminum gallium indium phosphide (AlGaInP) and gallium indium arsenide phosphide (GaInAsP).

8. The electrically pumped surface-emitting photonic crystal laser as claimed in claim 1, wherein the quantum structure includes at least a layer of quantum well.

9. The electrically pumped surface-emitting photonic crystal laser as claimed in claim 8, wherein the layer of quantum well is made of a material selected from a group consisting of indium arsenide phosphide (InAsP), gallium nitride (GaN), indium gallium arsenide (InGaAs), indium gallium nitride (InGaN), indium gallium phosphide (InGaP), aluminum gallium indium arsenide (AlGaInAs), aluminum gallium indium phosphide (AlGaInP) and gallium indium arsenide phosphide (GaInAsP).

10. The electrically pumped surface-emitting photonic crystal laser as claimed in claim 1, further comprising a buffer layer between the substrate and the first cladding layer.

11. The electrically pumped surface-emitting photonic crystal laser as claimed in claim 10, further comprising a first graded-index layer between the buffer layer and the first cladding layer.

12. The electrically pumped surface-emitting photonic crystal laser as claimed in claim 1, further comprising a first separate confinement heterostructure between the first cladding layer and the active layer and a second separate confinement heterostructure between the active layer and the second cladding layer.

13. The electrically pumped surface-emitting photonic crystal laser as claimed in claim 1, further comprising a second graded-index layer between the second cladding layer and the contact layer.

* * * * *

UNITED STATES PATENT AND TRADEMARK OFFICE
CERTIFICATE OF CORRECTION

PATENT NO. : 10,340,659 B1
APPLICATION NO. : 16/008223
DATED : January 8, 2013
INVENTOR(S) : Kuo-Jui Lin, Ming-Yang Hsu and Yu-Chen Chen It is certified that error appears in the above-identified patent and that said Letters Patent is hereby corrected as shown below:

On the Title Page

Item (75) Inventor is corrected to read:
-- KUO-JUI LIN, HSINCHU CITY, (TW);
MING-YANG HSU, HSINCHU CITY, (TW);
YU-CHEN CHEN, HSINCHU CITY, (TW);
CHIEN HUNG PAN, Hsinchu County, (TW) --.

Signed and Sealed this
Eighth Day of November, 2022

Katherine Kelly Vidal
*Director of the United States Patent and Trademark Office*